(12) United States Patent  
Jenkins et al.

(10) Patent No.: US 7,768,848 B2
(45) Date of Patent: Aug. 3, 2010

(54) ON-CHIP CHARACTERIZATION OF NOISE-MARGINS FOR MEMORY ARRAYS

(75) Inventors: Keith A. Jenkins, Sleepy Hollow, NY (US); Kevin G. Stawiasz, Bethel, CT (US)

(73) Assignee: International Business Machines Corporation, Armonk, NY (US)

( * ) Notice: Subject to any disclaimer, the term of this patent is extended or adjusted under 35 U.S.C. 154(b) by 255 days.

(21) Appl. No.: 11/935,205

(22) Filed: Nov. 5, 2007

(65) Prior Publication Data

US 2009/0116325 A1   May 7, 2009

(51) Int. Cl.
*G11C 29/00* (2006.01)

(52) U.S. Cl. .................. 365/201; 365/206; 365/226; 365/230.02

(58) Field of Classification Search ............... 365/206, 365/226, 229, 230.02, 201
See application file for complete search history.

(56) References Cited

U.S. PATENT DOCUMENTS

| | | | |
|---|---|---|---|
| 4,097,896 A | 6/1978 | Avery | |
| 5,327,463 A | 7/1994 | Matsumoto | |
| 5,936,892 A | 8/1999 | Wendell | |
| 6,958,947 B2 * | 10/2005 | Park et al. | 365/228 |
| 7,099,182 B2 | 8/2006 | Ohtake et al. | |
| 2003/0230733 A1 | 12/2003 | Tanaka | |
| 2004/0123207 A1 * | 6/2004 | Zumkehr et al. | 714/744 |

* cited by examiner

*Primary Examiner*—Pho M Luu
*Assistant Examiner*—Tha-O Bui
(74) *Attorney, Agent, or Firm*—Jon A. Gibbons; Fleit Gibbons Gutman Bongini & Bianco P.L.

(57) ABSTRACT

A circuit, method, and computer readable medium for on-chip measuring of noise margins in a memory device memory device are disclosed. The on-chip method includes electrically coupling at least a first circuit to a memory cell. A voltage divider is electrically coupled to at least a first voltage and a second voltage. A multiplexer circuit is electrically coupled to the voltage divider. The multiplexer selects one of the first voltage and second voltage for producing a test voltage. A selecting line is electrically coupled to a force\measure network. A comparator is coupled to the force\measure network. The force-measure network supplies the test voltage to the comparator and a measured voltage to the comparator for determining when the measured voltage exceeds the test voltage.

20 Claims, 6 Drawing Sheets

500 force A and measure B

| node | mode select | force switch | measure switch | reference switch |
|---|---|---|---|---|
| node A | 0 (force A) | 1 (closed) | 0 (open) | 0 (open) |
| node B | 1 (measure B) | 0 (open) | 1 (closed) | 1 (closed) | force B and measure A

| node | mode select | force switch | measure switch | reference switch |
|---|---|---|---|---|
| node A | 1 (measure A) | 0 (open) | 1 (closed) | 1 (closed) |
| node B | 0 (force B) | 1 (closed) | 0 (open) | 0 (open) |

FIG. 5

ON-CHIP CHARACTERIZATION OF NOISE-MARGINS FOR MEMORY ARRAYS

FIELD OF THE INVENTION

The present invention generally relates to the field of electronic circuits, and more particularly relates to characterizing noise-margins in memory arrays via on an on-chip circuit.

BACKGROUND OF THE INVENTION

As Complementary Metal-Oxide-Semiconductor ("CMOS") technology continues scaling to smaller critical dimensions, the intrinsic variability or mismatch between transistors, increases with the smaller transistors showing a much greater mismatch than larger ones. Random variations in device characteristics between devices of a circuit, wafer, chip or lot, are uncorrelated. Random sources of variations, which cause device mismatch between neighboring devices in a circuit, can adversely affect circuit behavior even more drastically than systematic variations in circuits such as Static Random Access Memory ("SRAM") cells and sense amplifiers.

Indeed, since systematic sources of variation equally affect neighboring devices, device mismatch between neighboring devices as a result of systematic sources is negligible as compared to device mismatch due to random sources of device characteristic variation. Thus, random variations in device characteristics (device mismatch) cause significantly more deviation especially in circuit performance of the above mentioned circuits, than systematic variations. Since random variations in device characteristics are uncorrelated, methods for characterizing or modeling such random variations are difficult and inaccurate. Providing the necessary "fixes" at the device and circuit levels so as to limit the adverse effects of such random variations on circuit performance, are expensive by way of silicon area consumed as compared to those for systematic variations.

Although device mismatch may be caused by any number of variations in device characteristics, random variations in Vt (threshold voltage) mismatch have significant impact on circuit performance for various types of MOS circuits. In MOSFET devices, for example, random variations in Vt between neighboring transistors are due primarily to fluctuations in number and position of dopant atoms, but other sources include, for example, randomness in line edge roughness of devices. Variations in Vt mismatch of MOSFETs of an SRAM cell can significantly degrade cell stability as is understood by those of ordinary skill in the art. Furthermore, Vt mismatches of transistors of a sense amplifier can adversely impact the offset voltage. In particular, because a sense amplifier senses a differential voltage applied at the gates of two neighboring sensing devices (transistors), if there is a Vt mismatch between such devices, the mismatch adds to the voltage that the sense amplifier must counter before it can amplify the desired signal. By way of further example, Vt mismatches can affect the performance of CMOS inverters, e.g., a Vt mismatch can cause variations in the trip voltage, that is, the point at which the output of the inverter switches between logic states "1" and "0".

SRAM is heavily impacted by Vt mismatch because SRAM designs typically use the smallest possible transistors. The variability can have a significant impact on yield. Therefore, various methods and techniques such as those describe in the co-pending U.S. patent application Ser. No. 10/643, 193, which is commonly herewith to International Business Machines, Inc. and is incorporated by reference in its entirety, have been designed to measure and characterize device mismatch of semiconductor transistors due to local variations in device characteristics resulting from random sources. In particular these methods measure and characterize Vt (threshold voltage) variations between neighboring MOSFETs (Metal Oxide Semiconductor Field Effect Transistors) of SRAM (Static Random Access Memory) cells or other logic devices. However, these methods require external analog testing equipment to perform measurements on a chip. The external analog equipment is usually slower than integrated, on-chip, digital electronics, which results in a slowing down of the manufacturing process.

Therefore a need exists to measure and overcome the problems with the prior art as discussed above.

SUMMARY OF THE INVENTION

Briefly, in accordance with the present invention, disclosed are a circuit, method, and computer readable medium for on-chip measuring of noise margins in a memory device memory device are disclosed. The on-chip method includes electrically coupling at least a first circuit to a memory cell. A voltage divider is electrically coupled to at least a first voltage and a second voltage. A multiplexer circuit is electrically coupled to the voltage divider. The multiplexer selects one of the first voltage and second voltage for producing a test voltage. A selecting line is electrically coupled to a force\measure network. A comparator is coupled to the force\measure network. The force-measure network supplies the test voltage to the comparator and a measured voltage to the comparator for determining when the measured voltage exceeds the test voltage.

In another embodiment, a memory device is disclosed. The memory device includes at least one memory cell. A circuit is electrically coupled to the memory cell for measuring noise margins in the memory device. The circuit includes a voltage divider supplying at least a first voltage and a second voltage. A multiplexer circuit is electrically coupled to the voltage divider. The multiplexer selects one of the first voltage and second voltage for producing a test voltage. A selecting line is electrically coupled to a force\measure network. A comparator is electrically coupled to the force\measure network. The force-measure network supplies the test voltage to the comparator and a measured voltage to the comparator for determining when the measured voltage exceeds the test voltage.

In yet another embodiment, a computer readable medium for on-chip for measuring noise margins in the memory device is disclosed. The computer readable medium comprises instructions for electrically coupling at least a first circuit to a memory cell. A voltage divider is electrically coupled to at least a first voltage and a second voltage. A multiplexer circuit is electrically coupled to the voltage divider. The multiplexer selects one of the first voltage and second voltage for producing a test voltage. A selecting line is electrically coupled to a force\measure network. A comparator is coupled to the force\measure network. The force-measure network supplies the test voltage to the comparator and a measured voltage to the comparator for determining when the measured voltage exceeds the test voltage.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

FIG. 5 illustrates a truth table according to an embodiment of the present invention.

DETAILED DESCRIPTION

Figure 1:
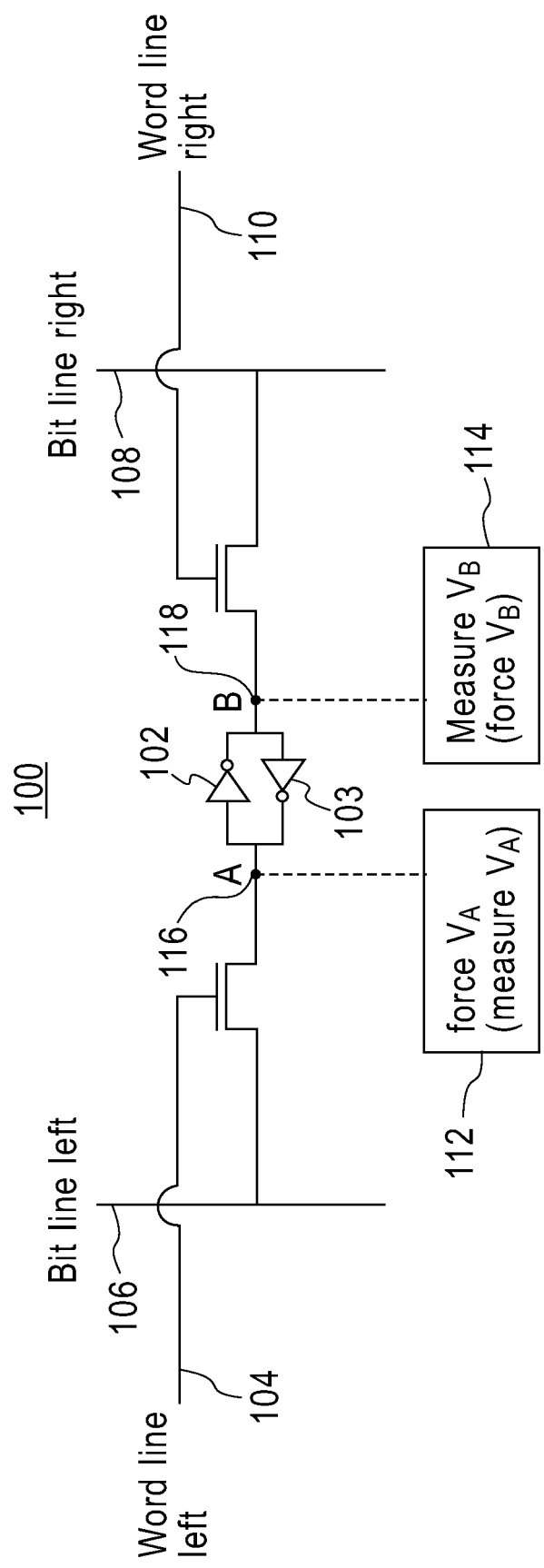
FIG. 1 is a schematic of a CMOS SRAM memory cell electrically coupled to a noise-margin characterization circuit according to an embodiment of the present invention.

The present invention could be produced as part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

One advantage of the present invention is that one or more noise-margin characterization circuits are placed onto a chip in order to simplify the testing procedures thereby increasing the speed/throughput of the measurement process. This results in a digital output, which does not require additional input or output connections. Another advantage of the present invention is that a series of resistive dividers are used to generate on-chip stimuli and comparator reference voltages. Substantially all measurement and result storage is on-chip and is controlled through a state machine or existing scan chains. Having all the instrumentation on chip greatly reduces the complexity of the test setup required for the measurements and has the potential for increasing the measurement throughput. In addition, the on-chip test and measurement circuitry reduces the reliance on specialized analog test equipment thereby making testing possible with any digital tester.

Increased throughput is beneficial for incorporating these measurements either inline or offline as a manufacturing process monitor. Current array yield monitors do not provide detail on what aspect of the array operation is limiting yield. Diagnostic measurements can presently only be made by using external voltage sourcing and measuring equipment, and dedicated input/output connections to the array of SRAMs to be tested. One advantage of the present invention is that it can provide the same diagnostic measurement without the external equipment or any addition input/output connections. Hence, measurement does not require bench test equipment, probes, and is not limited to small samples. SRAM testing can be done on any sample at any time.

On-Chip Characterization Of Noise-Margin in Memory Arrays

As discussed above, CMOS memory arrays such as SRAM are heavily impacted by Vt mismatch because SRAM designs typically use the smallest possible transistors. Therefore, the present invention, in one embodiment, provides voltage testing circuits on a chip for in-situ characterization of noise-margins. In other words, one embodiment, of the present invention provides a digital interface for analog measurements on SRAM modules.

Figure 2:
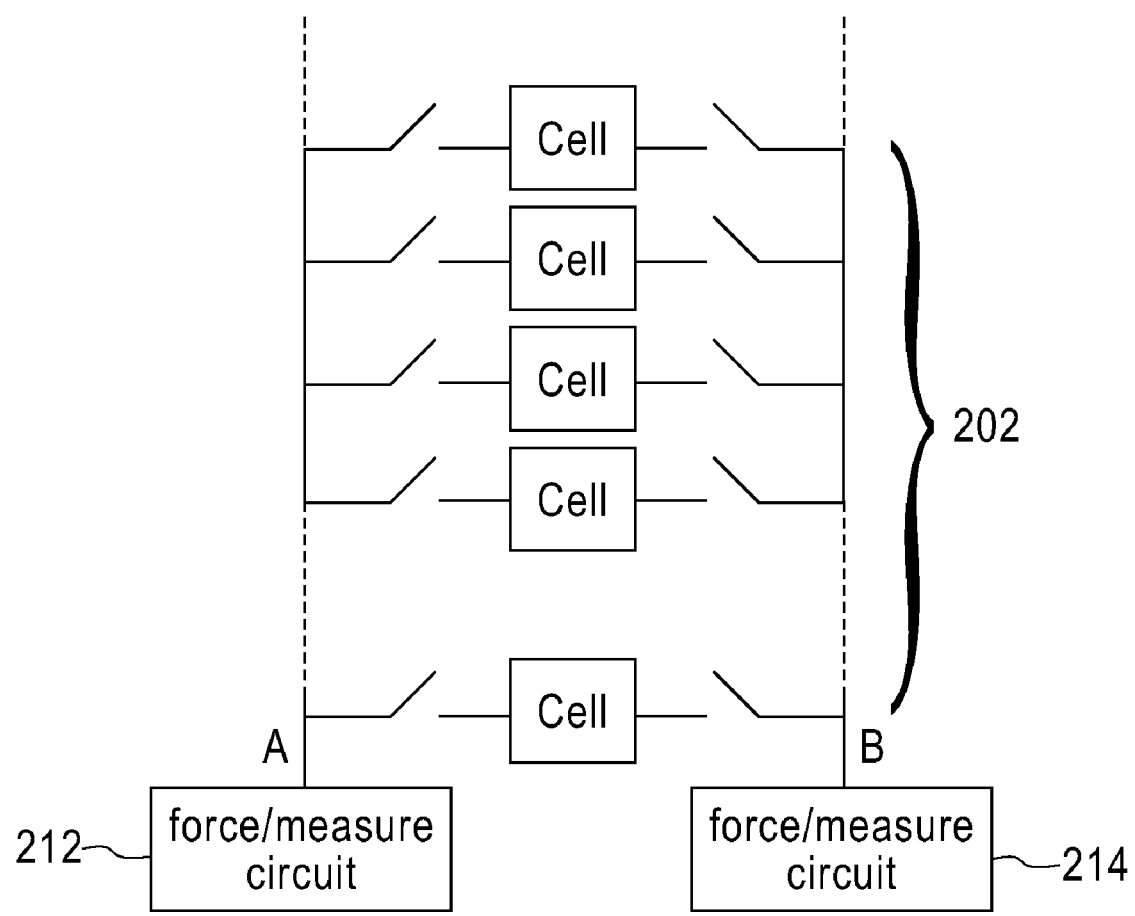
FIG. 2 is a schematic showing an example of how the noise-margin characterization circuit of FIG. 1 can be multiplexed across multiple memory cells according to an embodiment of the present invention.

FIG. 1 is a schematic illustrating one cell 100 of an SRAM array. The SRAM cell 100 of FIG. 1 comprises two cross-coupled invertors 102, 103 which are the basic storage units for the SRAM cell 100. Data is written to and read from the cross-coupled invertors 102, 103 by supplying voltage to the appropriate bit line 104, 108 and word line 106, 110, respectively. FIG. 1 also shows a noise-margin characterization circuit 112 electrically coupled to Node A 116 and a second voltage test circuit 114 electrically coupled to Node B 118. These in-situ noise-margin characterization circuits 112, 114, in one embodiment, measure the DC characteristics of the memory cell 100. It should be noted that each memory cell 100 in an SRAM module is not required to comprise separate noise-margin characterization circuits 112, 114. For example, FIG. 2 is a schematic showing two noise-margin characterization circuits 212, 214 being multiplexed across a plurality of memory cells 202.

The noise-margin characterization circuits 112, 114, in one embodiment, allow for two sets of measurements to be made. In one operation, the first noise-margin characterization circuit 112 forces a voltage $V_A$ onto the Node A 116 and measures the corresponding response on Node B 118. In another operation, the second noise-margin characterization circuit 114 forces a voltage $V_B$ onto Node B 118 and measures the corresponding response on Node A 116.

Figure 3:
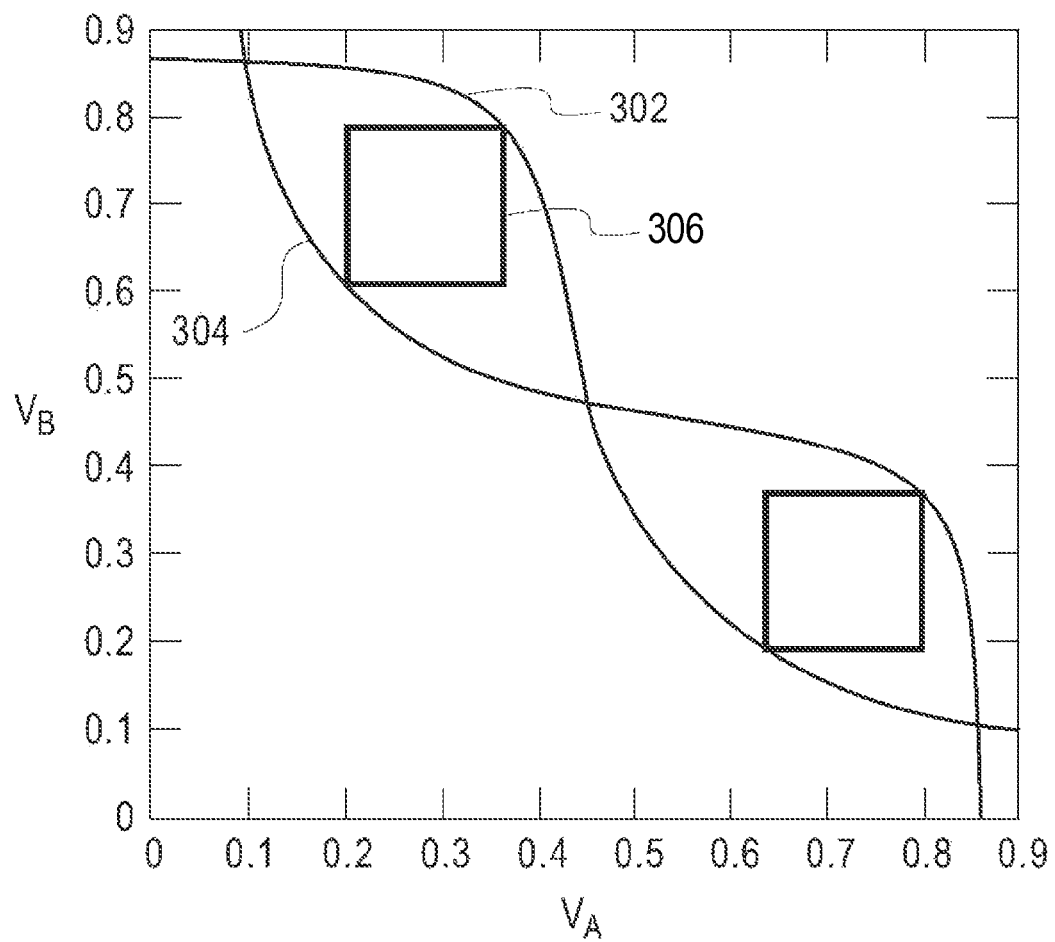
FIG. 3 shows an exemplary pair of transfer curves collectively referred to as butterfly curves according to an embodiment of the present invention.

The measurement desired from the noise-margin characterization circuits 112, 114 to characterize an SRAM cell 100 are the voltage transfer curves from Node A to Node B and from Node B to Node A. FIG. 3 shows one example of a transfer curve for an SRAM cell 100. In particular curve 302 represents voltage $V_A$ being forced onto Node A 116 and the corresponding response at Node B 118. Curve 304 represents voltage $V_B$ being forced onto Node B 118 and the corresponding response at Node A 116. As the voltage is increased across Node A 116 the voltage at Node B 118 stays relatively constant until a threshold is exceeded. The voltage at Node B 118 then switches to a low voltage state.

The box 306 between the two curves 302, 304 represents the static noise margin, which represents the memory cell's ability to retain the state of the data. The measurements across Node A 116 to Node B 118 and across Node B 118 to Node A 116 are performed so that the static noise margin can be determined. If the curves 302, 304 become smaller and closer together the static noise margin becomes smaller indicating that the memory cell 100 is becoming less stable.

When manufacturing SRAMs, the greater the distance between the two curves 302, 304 the better. However, as transistors become smaller and as silicon technology is scaled the shape of the curves and the "box" 306 are dependent on threshold voltage. If one of the two invertors 102, 103 has a different threshold voltage than the other inverter, the curves 302, 304 can shift thereby opening or closing the area between the curves 302, 304. In the presence of device variability, different curves are obtained for different cells, resulting in different noise margins. If the noise margin is too small, the memory cell is not reliable. It is important to measure such characteristic curves in order to understand the impact of variability on noise margins and yield. As discussed above, current methods for obtaining these curves by force and measuring voltages on Node A 116 and Node B 118 using external test equipment connected through dedicated input/output structures on a test site. However, one embodiment of the present invention provides an in-situ voltage testing circuit for characterizing the noise margin of an SRAM array, as shown in FIG. 1.

Figure 4:
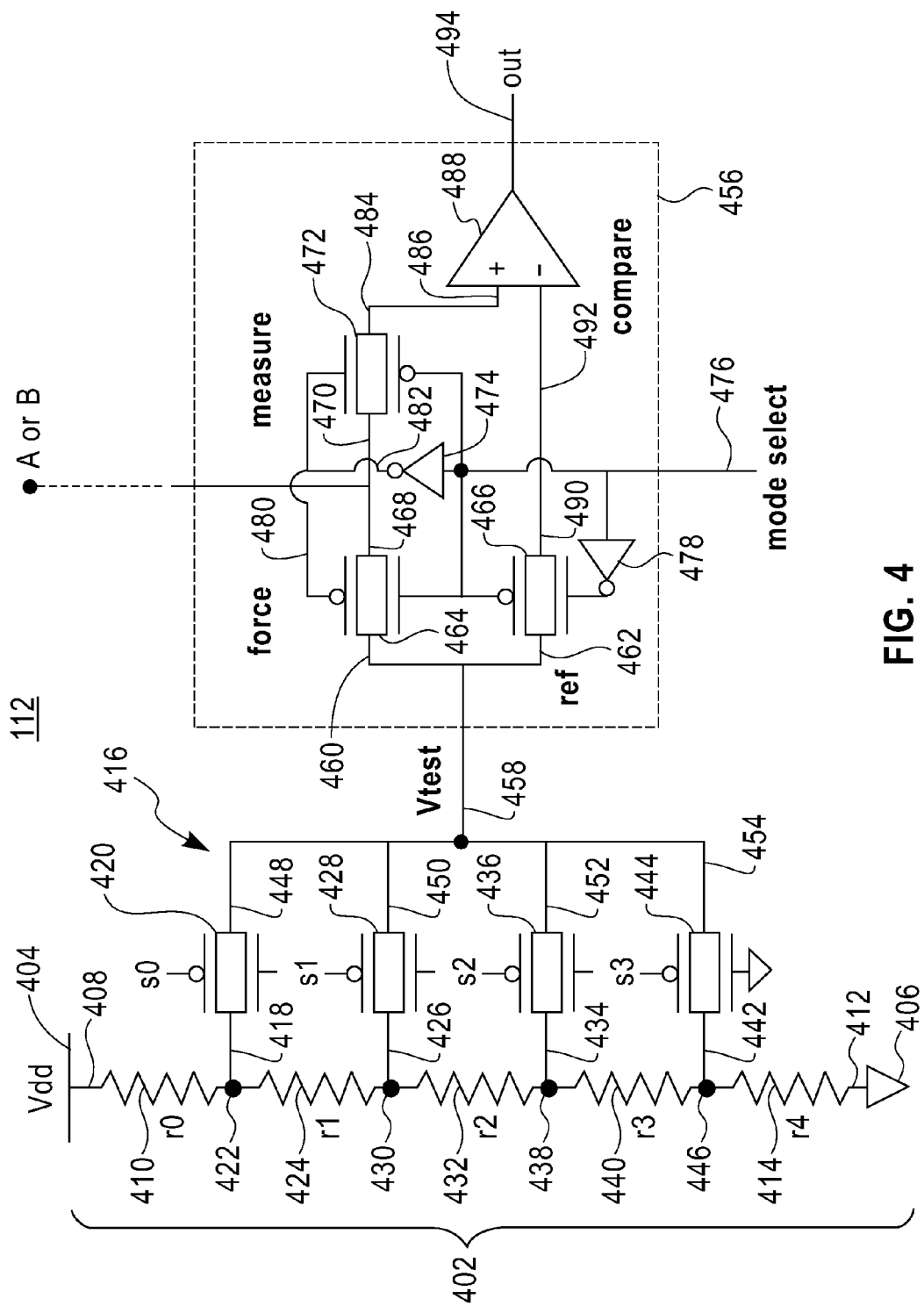
FIG. 4 is a schematic of a noise-margin characterization circuit according to an embodiment of the present invention.

FIG. 4 shows the noise-margin characterization circuit 112, 114 in more detail. It should be noted that FIG. 4 only shows one of the noise-margin characterization circuits 112, 114 of FIG. 1. As noted above, each of the nodes 116, 118 is electrically coupled to a separate noise-margin characterization circuit 112, 114. In one embodiment, the noise-margin characterization circuit 112, 114 comprises a plurality of resistors 402 electrically coupled to one another in series between a power supply Vdd 404 and ground 406. In particular, a first terminal 408 of a first resistor 410 is electrically coupled to Vdd 404 and a second terminal 412 of an Nth resistor 414. The plurality of resistors 402 is collectively referred to as a voltage divider 402. It should be noted that, in one embodiment, the values of the resistors are substantially equal. However, resistors with varying values can also be used. Also finer resolution of the resistor chain can be obtained with a different network (voltage divider 402), e.g., a set of parallel resistors connected to ground.

A selection of multiplexer ("MUX") circuits 416 is electrically coupled to the voltage divider 402. In particular, an input 418 of a first MUX circuit 420 is electrically coupled to a first node 422 in the voltage divider 402 between the first resistor 410 and second resistor 424. An input 426 of a second MUX circuit 428 is electrically coupled to a second node 430 in the voltage divider 402 between the second resistor 424 and a third resistor 432. An input 434 of a third MUX circuit 436 is electrically coupled to a third node 438 in the voltage divider 402 between the third resistor 432 and a fourth resistor 440. An input 442 of an Nth MUX circuit 444 is electrically coupled to an Nth node 446 in the voltage divider 402 between the fourth resistor 440 and an Nth resistor 414.

The outputs 448, 450, 452, 454 of each MUX circuit 420, 428, 436, 444 are electrically coupled to a force\measure circuit 456. The voltage divider 402 determines a voltage as derived from the power supply Vdd. The selection of multiplexer ("MUX") circuits 416 provides a Vtest voltage 458 to the force\measure circuit 456. Vtest 458, in one embodiment is determined by the ratio of the resistors selected by the transmission gates (MUX circuits) 420, 428, 436, 444. In one embodiment, only one transmission gate 420, 428, 436, 444 is opened at a time. The voltage divider 402 and the selection of multiplexer ("MUX") circuits 416 allows for increasing larger voltages to be applied at Vtest 458 based on the transmission gate opened. For example, if the first MUX circuit 420 is open, the largest voltage is applied at Vtest 458. IF the Nth MUX circuit 444 is open, the smallest voltage is applied at Vtest 458.

Vtest 458 is electrically coupled to an input 460 of a first switch 464 (a "force" switch) and an input 462 of a second switch 466 (a "reference" switch). An output 468 of the force switch 460 is electrically coupled to an input 470 of a third switch 472 (a "measure" switch). A first inverter 474 is electrically coupled to the force, reference, and measure switches 464, 466, 472. A second inverter 478 is electrically coupled to the reference switch 466. A mode select line 476 is electrically coupled to the first inverter 474 and the force, reference, and measure switches 464, 466, 472.

A force\measure line 480 is electrically coupled to the force switch 464, measure switch 472 and an output 482 of the first inverter 474 for opening or closing each of the force and measure switches 460, 472. The mode select line 476 enables either the force or measure function of the force\measure circuit 456, as discussed in greater detail below. The operation of the circuit 112 can be controlled by a finite state machine and data register, or by scan chains. For example, FIG. 5 shows a truth table 500 for a state machine illustrating the modes of the force\measure circuit 456. In particular, the truth table 500 shows that when the mode select line 476 is asserted low, the force switch 464 is asserted high and the measure and reference switches 472, 466 are asserted low. Alternatively, when the mode select line 476 is asserted high, the force switch 464 is asserted low and the measure and reference switches 472, 466 are asserted high.

An output 484 of the third switch 472 is electrically coupled to a positive input 486 of a comparator 488. An output 490 of the second switch 466 is electrically coupled to a negative input 492 of the comparator 488. An output 494 of the comparator 488 yields results that signals whether a measured value at Node A 116 or Node B 118 exceeds the Vtest 458 voltage.

The following discussion illustrates an exemplary operation of the force\measure circuit 456. In voltage force mode (e.g., mode select line 478 asserted low), the force/measure signal is high, that is, a logical "1", and the voltage, Vtest, is connected to Node A 116 or Node B 118. When a measurement function is desired, the force/measure signal is set to low, that is, logical "0" and the measure switch 472 and the reference switch 466 are opened, while the force switch 466 is closed. The reference switch 466 applies the selected voltage, Vtest, to one input 492 of a comparator, and the measure switch 472 applies the voltage at Node A 116 or Node B 118 to the other input of the comparator.

If the voltage at Node A 116 or Node B 118 is higher than the reference voltage, then the comparator output 494 is a "1"; if it is lower, then the comparator output 494 is a "0". Hence the comparator output 494 indicates if the cell voltage at Node A 116 or Node B 118 is higher or lower than the Vtest voltage 458 selected. The comparator 488 has high input impedance, so the measured voltage is not affected by the comparator 488. After performing the above measurement process two outputs are obtained, an output associated with Node A 116 and an output associated with Node B 118. Therefore, based on these outputs transfer characteristic curves such as those shown in FIG. 2 can be obtained.

It should be noted that the sequence of measurement steps can be chosen based on the need. Also, full transfer curves can be obtained by full sweeps, or pass/fail tests can be obtained by only a few voltages corresponding to the noise margin requirements. Full curves can be generated, in one embodiment, as follows. The transfer curve from Node A 116 to Node B 118 is measured as follows: Vtest to forcing voltage A can be chosen by selecting the first MUX circuit 420 electrically coupled to Node A 116; Vtest to measuring voltage B can be selected first by selecting the first MUX circuit electrically coupled to Node B 118 (as discussed above each node is electrically coupled to a corresponding a noise-margin characterization circuit). If comparator "out" equals "1" then the index 0 is stored in a register or shifted off chip by a scan chain. If comparator "out" equals "0" then Vtest (B side) is selected by a second MUX circuit 428. If comparator "out" now equals "1" then the index is stored, if not, the selection S (B side), e.g. S0, S1, S2, is incremented again.

After going through all the Vtest(side B) switches, the index corresponding to the comparator switching from "0" to "1" is stored, i.e., the voltage on B is indicated. Voltage on Node A 116 is then changed by selecting a second MUX circuit 428, and the loop at Node B 118 is repeated until an entire table corresponding to a transfer curve is generated. The transfer curve from Node B to 118 Node A 116 is measured similarly to the process above. It is noted however that other sequences of the force\measure selection may be utilized to obtain the same measurements.

It should be noted that pass/fail tests can be performed by having a state machine or scan chains select the force/measure points to the desired values, e.g., the limits of the noise margin boxes of FIG. 2. The comparator output 494 can then be queried to test if the output voltages are greater than the required values.

As can be seen from the above discussion the on-chip noise-margin characterization circuits simplify the testing procedures for an SRAM module. The noise-margin characterization circuits provide a digital output for analog measurements without the need for additional input or output connections. Substantially all measurement and result storage is on-chip and is controlled through a state machine or existing scan chains. Having all the instrumentation on chip greatly reduces the complexity of the test setup required for the measurements and has the potential for increasing the measurement throughput.

Process Of On-Chip Noise-Margin Characterization

Figure 6:
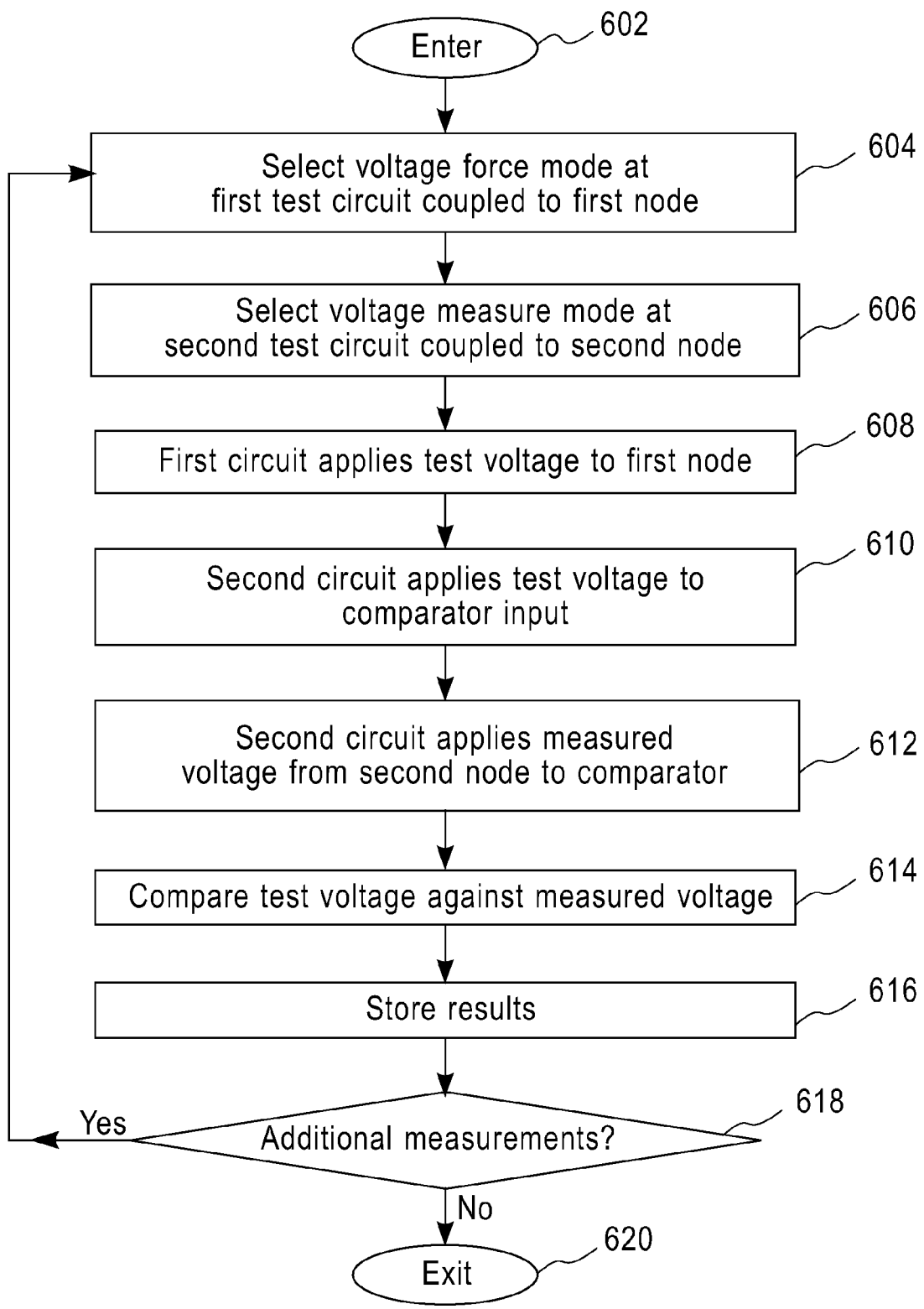
FIG. 6 is an operational flow diagram illustrating a process for performing on-chip noise-margin characterization for an SRAM module according to an embodiment of the present invention.

FIG. 6 is an operational diagram illustrating an exemplary process of characterizing noise-margins for an SRAM module utilizing on-chip noise-margin characterization circuits. The operational flow diagram of FIG. 6 begins at step 602 and flows directly to step 604. A voltage force mode at a first on-chip noise-margin characterization circuit 112 electrically coupled to a first node, at step 604, is selected. The first node can be either Node A 116 or Node B 118. A voltage measure at a second on-chip noise-margin characterization circuit 114 electrically coupled to a second node, at step 606, is selected. The second node can be either Node A 116 or Node B 118, and in one embodiment, is the complement to the node selected in step 604.

The first on-chip noise-margin characterization circuit 112, at step 608, applies a test voltage to the node selected in step 604. The second noise-margin on-chip characterization circuit 114, at step 610 applies a test voltage to the negative input (492) of comparator 488 and then at step 612, applies a measured voltage from the second node, selected at step 606, to the positive input (486) of comparator 488. The test voltage, at step 614, is compared against the measured voltage. The result of the comparison, at step 616, is then stored. The control flow then braches at step 618. If additional measurements are desired, the control flow loops back to step 604. If all measurements are complete, the control flow then exits at step 620.

Non-Limiting Examples

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A memory device comprising:

at least one memory cell; and a circuit residing on the memory device and electrically coupled to the memory cell for measuring noise margins in the memory device, the circuit comprising:

a voltage divider supplying at least a first voltage and a second voltage;

a multiplexer circuit electrically coupled to the voltage divider, wherein the multiplexer selects one of the first voltage and second voltage for producing a test voltage;

a selecting line electrically coupled to a force\measure network; and a comparator electrically coupled to the force\measure network, wherein the force-measure network supplies the test voltage to the comparator and a measured voltage to the comparator for determining when the measured voltage exceeds the test voltage.

2. The memory device of claim 1, further comprising:
at least one additional circuit electrically coupled to the memory cell for measuring noise margins in the memory device, the circuit comprising:
- a voltage divider supplying at least a first voltage and a second voltage;
- a multiplexer circuit electrically coupled to the voltage divider, wherein the multiplexer selects one of the first voltage and second voltage for producing a test voltage;
- a selecting line electrically coupled to a force\measure network; and
- a comparator electrically coupled to the force\measure network, wherein the force\measure network supplies the test voltage to the comparator and a measured voltage to the comparator for determining whether the measured voltage exceeds the test voltage.

3. The memory device of claim 1, wherein the memory device is a Static Random Access Memory ("SRAM") device.

4. The memory device of claim 1, wherein the voltage divider comprises a plurality of resistors electrically coupled to each other in series.

5. The memory device of claim 2, wherein the circuit is electrically coupled to a first node of the memory cell and wherein the additional circuit is electrically coupled to a second node of the memory cell.

6. The memory device of claim 1, wherein when the selecting line is asserted high, the test voltage is applied to a first node electrically coupled to circuit, wherein the measured voltage is a voltage measured at a second node electrically coupled to circuit while the test voltage is being applied to the first node.

7. The memory device of claim 1, wherein when the selecting line is asserted low, the measured voltage is applied to the comparator, wherein the measured voltage is a voltage measured at a first node electrically coupled to the circuit while the test voltage is applied to a second node electrically coupled to the circuit.

8. An on-chip method for measuring noise margins in the memory device, the method comprising:
- forming at least a first circuit on the memory device that measures noise margins in the memory device;
- electrically coupling the at least first circuit to a memory cell, wherein the electrically coupling comprises:
  - supplying, by a voltage divider at least a first voltage and a second voltage;
  - electrically coupling a multiplexer circuit to the voltage divider, wherein the multiplexer selects one of the first voltage and second voltage for producing a test voltage;
  - electrically coupling a selecting line to a force\measure network; and
  - electrically coupling a comparator to the force\measure network, wherein the force-measure network supplies the test voltage to the comparator and a measured voltage to the comparator for determining when the measured voltage exceeds the test voltage.

9. The on-chip method of claim 8, further comprising:
electrically coupling at least one additional circuit to the memory cell for measuring noise margins in the memory device, the electrically coupling comprising:
- supplying, by a voltage divider, at least a first voltage and a second voltage;
- electrically coupling a multiplexer circuit to the voltage divider, wherein the multiplexer selects one of the first voltage and second voltage for producing a test voltage;
- electrically coupling a selecting line to a force\measure network; and
- electrically coupling a comparator to the force\measure network, wherein the force\measure network supplies the test voltage to the comparator and a measured voltage to the comparator for determining whether the measured voltage exceeds the test voltage.

10. The on-chip method of claim 8, wherein the memory device is a Static Random Access Memory ("SRAM") device.

11. The on-chip method of claim 8, wherein the voltage divider comprises a plurality of resistors electrically coupled to each other in series.

12. The on-chip method of claim 8, wherein when the selecting line is asserted high, the test voltage is applied to a first node electrically coupled to circuit, wherein the measured voltage is a voltage measured at a second node electrically coupled to circuit while the test voltage is being applied to the first node.

13. The on-chip method of claim 8, wherein when the selecting line is asserted low, the measured voltage is applied to the comparator, wherein the measured voltage is a voltage measured at a first node electrically coupled to the circuit while the test voltage is applied to a second node electrically coupled to the circuit.

14. A memory device comprising:
- at least one memory cell comprising at least one pair of cross-coupled invertors; and
- a circuit residing on the memory device and electrically coupled to the memory cell for measuring noise margins in the memory device, the circuit comprising:
  - a voltage divider supplying at least a first voltage and a second voltage;
  - a multiplexer circuit electrically coupled to the voltage divider, wherein the multiplexer selects one of the first voltage and second voltage for producing a test voltage, wherein the test voltage is electrically coupled to an input of a first switch and an input of a second switch, wherein an output of the first switch is electrically coupled to an input of a third switch;
  - a first inverter electrically coupled to the first switch, second switch, and third switch;
  - a second inverter electrically coupled to the second switch, wherein the first and second inverters are cross-coupled;
  - a selecting line electrically coupled to a force\measure network; and
  - a comparator electrically coupled to the force\measure network, wherein the force-measure network supplies the test voltage to the comparator and a measured voltage to the comparator for determining when the measured voltage exceeds the test voltage.

15. The memory device of claim 14, further comprising:
at least one additional circuit electrically coupled to the memory cell for measuring noise margins in the memory device, the circuit comprising:
- a voltage divider supplying at least a first voltage and a second voltage;
  - a multiplexer circuit electrically coupled to the voltage divider, wherein the multiplexer selects one of the first voltage and second voltage for producing a test voltage, wherein the test voltage is electrically coupled to an input of a first switch and an input of a second switch, wherein an output of the first switch is electrically coupled to an input of a third switch;
  - a first inverter electrically coupled to the first switch, second switch, and third switch;

a second inverter electrically coupled to the second switch, wherein the first and second inverters are cross-coupled;

a selecting line electrically coupled to a force\measure network; and a comparator electrically coupled to the force\measure network, wherein the force-measure network supplies the test voltage to the comparator and a measured voltage to the comparator for determining when the measured voltage exceeds the test voltage.

16. The memory device of claim 14, wherein the memory device is a Static Random Access Memory ("SRAM") device.

17. The memory device of claim 14, wherein the voltage divider comprises a plurality of resistors electrically coupled to each other in series.

18. The memory device of claim 15, wherein the circuit is electrically coupled to a first node of the memory cell and wherein the additional circuit is electrically coupled to a second node of the memory cell.

19. The memory device of claim 14, wherein when the selecting line is asserted high, the test voltage is applied to a first node electrically coupled to circuit, wherein the measured voltage is a voltage measured at a second node electrically coupled to circuit while the test voltage is being applied to the first node.

20. The memory device of claim 14, wherein when the selecting line is asserted low, the measured voltage is applied to the comparator, wherein the measured voltage is a voltage measured at a first node electrically coupled to the circuit while the test voltage is applied to a second node electrically coupled to the circuit.

* * * * *